(12) United States Patent
Lasserre

(10) Patent No.: US 8,984,383 B2
(45) Date of Patent: Mar. 17, 2015

(54) METHODS FOR DECODING, METHODS FOR RETRIEVING, METHOD FOR ENCODING, METHOD OF TRANSMITTING, CORRESPONDING DEVICES, INFORMATION STORAGE MEANS AND COMPUTER PROGRAM PRODUCTS

(71) Applicant: Canon Kabushiki Kaisha, Tokyo (JP)

(72) Inventor: Sébastien Lasserre, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 103 days.

(21) Appl. No.: 13/766,586

(22) Filed: Feb. 13, 2013

(65) Prior Publication Data

US 2013/0219250 A1 Aug. 22, 2013

(30) Foreign Application Priority Data

Feb. 16, 2012 (GB) .................................. 1202682.9

(51) Int. Cl.
*H04L 1/00* (2006.01)
*H03M 13/05* (2006.01)
(Continued)

(52) U.S. Cl.
CPC .......... *H03M 13/05* (2013.01); *H03M 13/3738* (2013.01); *H03M 13/3707* (2013.01); *H03M 13/1171* (2013.01); *H03M 13/353* (2013.01); *H03M 13/6312* (2013.01)
USPC ........... 714/799; 714/776; 714/752; 714/774; 714/780

(58) Field of Classification Search
CPC ..................... H03M 13/3738; H03M 13/3707; H03M 13/00; H03M 13/05; H03M 13/1171; H03M 13/6312; H03M 13/353; H03M 13/1108; H03M 13/45
See application file for complete search history.

(56) References Cited

U.S. PATENT DOCUMENTS

| 6,345,126 B1 | 2/2002 | Vishwanath et al. |
| 2008/0320362 A1* | 12/2008 | Taubin et al. .................. 714/755 |

(Continued)

FOREIGN PATENT DOCUMENTS

| WO | 2007057885 A2 | 5/2007 |
| WO | 2007135657 A2 | 11/2007 |
| WO | WO2007/135657 | * 11/2007 ............ H03M 13/00 |

OTHER PUBLICATIONS

Thomas Wiegand et al., "Joint Draft ITU-T Rec. H.264 ISO/IEC 14496-10 Amd.3 Scalable video coding", JVT of ISO/IEC MPEG & ITU-T VCEG, 24th Meeting: Geneva, Switzerland, Jun. 29-Jul. 5, 2007, 29 pages.

(Continued)

*Primary Examiner* — John P Trimmings
(74) *Attorney, Agent, or Firm* — Canon USA Inc. IP Division

(57) ABSTRACT

A method for decoding comprises the following steps:
receiving a first codeword comprising a plurality of elements of a first finite commutative group and associated to a plurality of symbols in accordance with a first code defining codeword elements by respective summations in said first commutative group;
determining, by applying a projection onto elements of the first codeword, a second codeword comprising a plurality of elements of a second finite commutative group having a cardinal strictly smaller than the cardinal of the first finite commutative group, wherein the projection is a morphism from the first finite commutative group to the second finite commutative group;
decoding the second codeword in accordance with a second code defining codeword elements by respective summations in said second commutative group.

17 Claims, 5 Drawing Sheets

(51) Int. Cl.
　　　*H03M 13/11*　　(2006.01)
　　　*H03M 13/35*　　(2006.01)
　　　*H03M 13/00*　　(2006.01)
　　　*H03M 13/37*　　(2006.01)

(56) References Cited

U.S. PATENT DOCUMENTS

2009/0249163 A1* 10/2009 Ovchinnikov et al. ....... 714/755
2010/0088575 A1*  4/2010 Sharon et al. ................ 714/763
2012/0272117 A1* 10/2012 Stadelmeier et al. ......... 714/752

OTHER PUBLICATIONS

Alban Goupil et al., "FFt-based BP Decoding of General LDPC Codes over Abelian Groups", IEEE transactions on communications, 55(4), 2007, pp. 644-649.
David Declercq, "Decoding and Performance of Nonbinary LDPC codes", in NewCom SWP1 meeting, Apr. 28, 2005, pp. 1-11.
Bo Zhou et al., "Construction of Non-Binary Quasi-Cyclic LDPC Codes by Arrays and Array Dispersions", IEEE Transactions on Communications, vol. 57, No. 6, June 2009, pp. 1652-1662.
Jonathan S. Yedidia et al., "Understanding Belief Propagation and its Generalizations", Mitsubishi Electric Research Laboratories, Jan. 2002, 35 pages.
R. Michael Tanner, "A Recursive Approach to Low Complexity Codes", IEEE Transactions on Information Theory, vol. IT-27, No. 5, Sep. 1981, pp. 533-547.
Xiaofei Huang et al., "Fast Min-Sum Algorithm over GF(q)", IEEE Information Theory Workshop, Chengdu, China, 2006, 4 pages.
Valentin Savin, "Min-Max decoding for non binary LDPC codes", IEEE International Symposium on Information Theory, 2008, 8 pages.
Matteo Frigo et al., "The Design and Implementation of FFTW3", Proc. IEEE, vol. 93, No. 2, 2005, pp. 216-231.
Laura Conde-Canencia et al., "Complexity Comparison of Non-Binary LDPC Decoders", ICT-Mobile Summit 2009, Conference Proceedings, pp. 1-8.
Bruno Macchiavello et al., "Distributed video codec with complexity scalability based on mixed resolution coding", 10 pages.
ITU-T H.264, "Series H: Audio and Multimedia Systems Infrastructure of audiovisual services—Coding of moving video, Advanced video coding for generic audiovisual services", Telecommunication Standardization Sector of ITU, International Telecommunication Union, 674 pages.

* cited by examiner

METHODS FOR DECODING, METHODS FOR RETRIEVING, METHOD FOR ENCODING, METHOD OF TRANSMITTING, CORRESPONDING DEVICES, INFORMATION STORAGE MEANS AND COMPUTER PROGRAM PRODUCTS

This application claims benefit under 35 USC §119 of United Kingdom application No. 1202682.9 filed on Feb. 16, 2012, which is incorporated herein by reference.

FIELD OF THE INVENTION

It is known to use an error correcting code to retrieve a transmitted set of data despite errors occurred during the transmission of data: redundant data (sometimes simply called "checks") is sent together with the transmitted set of symbols (representing e.g. part of a message, or audio or video data) and makes it possible to recover the set of symbols initially sent, even if the received set of symbols contains a limited number of errors.

In practice, redundant data is a codeword c, i.e. a vector c associated to a set x of symbols to be transmitted by the following relationship: c=Hx, where H is the parity check matrix defining the code used and the symbols to be transmitted are represented in x as a column.

Due to possible errors in transmission, the received set of symbols x' and codeword c' may differ from the set of symbol x and the codeword c that were sent. However, by seeking the nearest set of symbols x" and associated codeword c" (i.e. for instance the set of symbols x" and codeword c" having the fewest differences respectively with the received set of symbols x' and the received codeword c', and such that c"=Hx"), the decoder can generally retrieve the initial set of symbols (i.e. x"=x).

On the other hand, it is known to transmit data, representing for instance video, as a base layer and an enhancement layer. Such scalable picture or video data makes it possible to transmit only the base layer in order to reproduce at the receiver a picture or video having a given quality, and to further transmit the enhancement layer to obtain, by using both the base layer and the enhancement layer, a picture or video having an improved quality compared to the given quality.

The enhancement layer may always be transmitted (for instance after the base layer to obtain first a display of a picture at a low quality, and then at an improved quality), or it may only optionally be transmitted. In such a case, the decision to transmit the enhancement layer may be made for instance based on the available bandwidth for transmission or depending on the features of the display at the receiver.

Conventionally, encoding for error correction is performed by separately and independently encoding the base and enhancement layers, as described for instance in U.S. Pat. No. 6,345,126.

SUMMARY OF THE INVENTION

In this context, the invention provides a method for decoding comprising the following steps:
- receiving a first codeword comprising a plurality of elements of a first finite commutative group and associated to a plurality of symbols in accordance with a first code defining codeword elements by respective summations in said first commutative group;
- determining, by applying a projection onto elements of the first codeword, a second codeword comprising a plurality of elements of a second finite commutative group having a cardinal strictly smaller than the cardinal of the first finite commutative group, wherein the projection is a morphism from the first finite commutative group to the second finite commutative group;
- decoding the second codeword in accordance with a second code defining codeword elements by respective summations in said second commutative group.

A scalable code is thus defined: decoding may be performed by use of the second code, based on elements obtained by projecting elements relating to the first code. This may be useful in a number of cases, for instance when decoding in accordance with the first code is unsuccessful and may thus be attempted with the second, more robust, code. Decoding by the two codes is however interrelated, as further explained below, which is more efficient than sending two distinct layers.

The invention also provides a method for retrieving an information word, comprising the following steps:
- receiving, on a transmission channel, a first codeword comprising a plurality of elements of a first finite commutative group;
- attempting retrieval of said information word, using the first codeword and according to a first code defining codeword elements by respective summations in said first commutative group;
- in case of failure of said retrieval,
  - a determining, by applying a projection to elements of the first codeword, a second codeword comprising a plurality of elements of a second finite commutative group having a cardinal strictly smaller than the cardinal of the first finite commutative group, wherein the projection is a morphism from the first finite commutative group to the second finite commutative group;
  - attempting retrieval of said information word, using the second codeword and according to a second code defining codeword elements by respective summations in said second commutative group.

The first finite commutative group and the second finite commutative groups are for instance modular groups. In this context, it may be provided that the cardinal of the second finite commutative group is a divisor of the cardinal of the first finite commutative group and that the projection is a modulo operation having a modulus equal to the cardinal of the second finite commutative group.

In the embodiment described below, the information word is representative of data included in a video enhancement layer. The present invention however applies to any type of information word and is not limited to the video application.

According to a possible embodiment, the method may include a step of determining a predictor of said information word based on a video base layer, in which case the step of attempting retrieval using the first codeword may be performed based on said predictor. It is not necessary in such a situation to transmit the information word, as explained in relation with the embodiment described later.

It may be provided a step of projecting elements of said predictor, the projected elements forming a projected predictor; the step of attempting retrieval using the second codeword may then be performed based on said projected predictor.

According to another embodiment, the method may include a step of receiving a transmitted information word; the step of attempting retrieval using the first codeword may then be performed based on said transmitted information word.

It may be provided in this context a step of projecting elements of said transmitted information word and the step of attempting retrieval using the second codeword may then be performed based on said projected elements.

The invention also provides a method for encoding a word comprising a plurality of symbols, comprising the following steps:

encoding said word into a first codeword associated to said word in accordance with a first code defining codeword elements by respective summations in said first commutative group;

determining, by applying a projection to elements of the first codeword, a second codeword comprising a plurality of elements of a second finite commutative group having a cardinal strictly smaller than the cardinal of the first finite commutative group, wherein the projection is a morphism from the first finite commutative group to the second finite commutative group.

It is thus proposed a method of transmitting a word comprising a plurality of symbols, comprising the following steps:

encoding said word using an encoding method as provided above;

obtaining a projected word by projection of said word;

transmitting said projected word and said second codeword on a transmission channel.

In a corresponding manner, the invention provides a decoding device comprising:

a receiving module configured to receive a first codeword comprising a plurality of elements of a first finite commutative group and associated to a plurality of symbols in accordance with a first code defining codeword elements by respective summations in said first commutative group;

a computing module configured to determine, by applying a projection to elements of the first codeword, a second codeword comprising a plurality of elements of a second finite commutative group having a cardinal strictly smaller than the cardinal of the first finite commutative group, wherein the projection is a morphism from the first finite commutative group to the second finite commutative group;

a decoding module configured to decode the second codeword in accordance with a second code defining codeword elements by respective summations in said second commutative group.

It is also proposed a device for retrieving an information word, comprising:

a receiving module configured to receive, on a transmission channel, a first codeword comprising a plurality of elements of a first finite commutative group;

a decoding module configured to attempt retrieval of said information word, using the first codeword and according to a first code defining codeword elements by respective summations in said first commutative group;

a computing module configured, in case of failure of said retrieval, to determine, by applying a projection to elements of the first codeword, a second codeword comprising a plurality of elements of a second finite commutative group having a cardinal strictly smaller than the cardinal of the first finite commutative group, wherein the projection is a morphism from the first finite commutative group to the second finite commutative group;

wherein the decoding module is configured to attempt retrieval of said information word, using the second codeword and according to a second code defining codeword elements by respective summations in said second commutative group.

The invention also provides an information storage means, possibly totally or partially removable, able to be read by a computer system, comprising instructions for a computer program adapted to implement a method as any of the methods provided above, when this program is loaded into and executed by the computer system.

It is also proposed a computer program product able to be read by a microprocessor, comprising portions of software code adapted to implement a method as any of the methods provided above, when it is loaded into and executed by the microprocessor.

BRIEF DESCRIPTION OF THE DRAWINGS

Other features and advantages of the invention will appear in light of the following description, made with reference to the appended drawings, where.

DETAILED DESCRIPTION OF EMBODIMENTS

Figure 1:
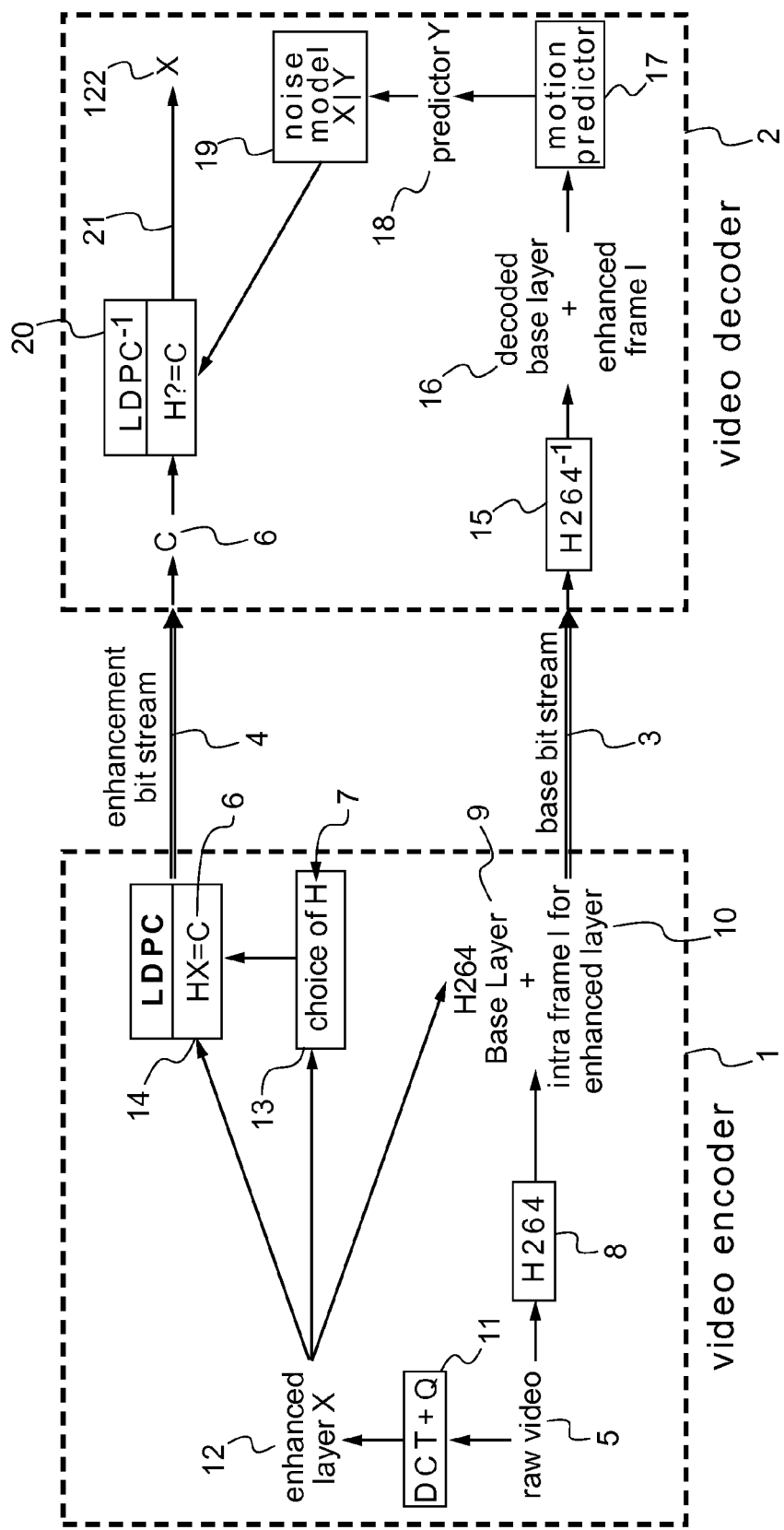
FIG. 1 shows an exemplary video encoder and a corresponding video decoder using encoding and decoding methods in accordance with the teachings of the invention.

FIG. 1 represents a video encoder 1 adapted to produce a base bit stream 3, e.g. a bit stream compliant with the H264 standard, and an enhancement bit stream 4 including a scalable error correction code as provided by the present invention.

Precisely, the encoder 1 includes a first module 8 adapted to encode a raw video stream 5 into a base layer 9 in accordance with the H264 standard. The first module 8 is also adapted to produce a complementary stream 10 defining an enhanced version of the intra frames I of the base layer 9.

Figure 2:
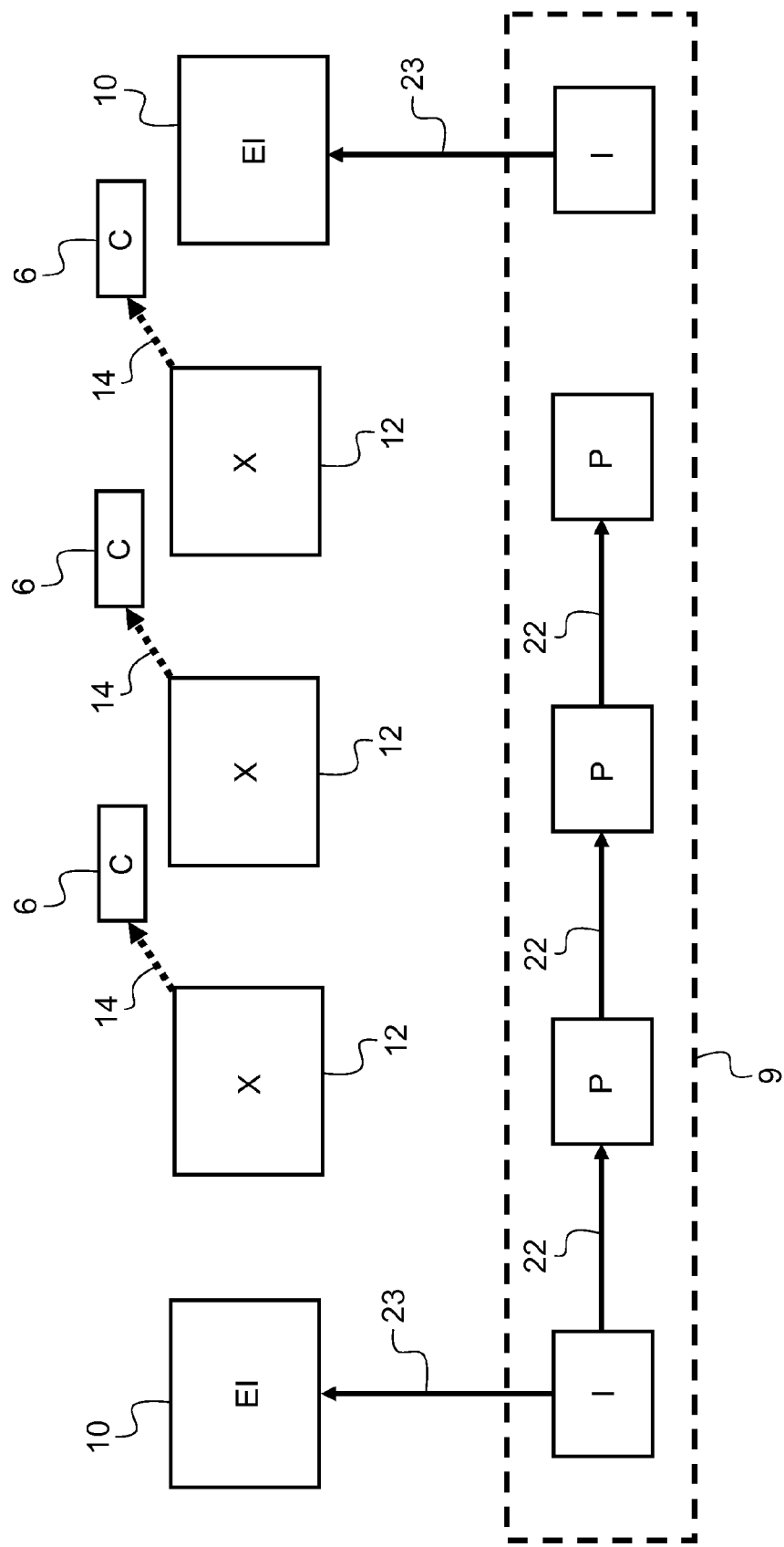
FIG. 2 illustrates an exemplary group of pictures of a base layer.

FIG. 2 shows an exemplary group of pictures of the base layer 9 comprising 2 intra pictures I and three inter pictures P corresponding to images temporally situated between the 2 intra pictures I. Inter pictures P are encoded by temporal prediction based on neighbouring intra pictures I, as represented by arrows 22 in FIG. 2.

As noted above, an enhanced version EI of intra frame I is defined by data included in the complementary stream 10, based on the base version of the intra frame I, as shown by arrow 23.

The base layer 9 and the complementary stream 10 form the base bit stream 3.

The encoder 1 also includes a second module 11 adapted to produce an enhancement layer 12 by transforming (e.g. using a Discrete Cosine Transform) and quantifying the raw video stream 5.

Sets of data X forming the enhancement layer 12 are then encoded into a codeword C (referenced 6 in FIG. 1) using an error correction code 7, for instance an LDPC code, defined by a matrix H (using here one of the matrix H″ defined below): HX=C. Codewords C thus obtained form the enhancement bit stream 4.

According to a possible embodiment, the error correction code 7 used for encoding sets of data X of the enhancement layer 12 can be selected by a selection module 13 from a plurality of available error correction codes, for instance to obtain a desired code rate. This selection may be performed based on the entropy of the set of data X or based on the estimation of the entropy H(X|Y). In the latter case, the predictor Y (used at the decoder as explained below) may be generated or estimated at the encoder side.

The encoded video stream produced by encoder 1 thus comprises the base bit stream 3 and the enhancement bit stream 4.

The encoded video stream is transmitted to a video decoder 2, for instance via a communication channel. According to a possible variation, the encoded video stream can be recorded on a recording medium, such as a hard disk, and later read so as to be decoded by the video decoder 2.

The base bit stream 3 and the enhancement bit stream 4 included in the encoded video stream are thus received at the decoder 2.

The base bit stream 3 is decoded by a first module 15 of the decoder 2 into the base version (i.e. low resolution version) of the images I, P coded in the base layer and into the enhanced version EI (i.e. high resolution version) of the intra images. The first module 15 is for instance a standard H264 decoder.

For each inter image P of the group of images being decoded, a second module 17 of the decoder 2 then computes a predictor Y of the enhanced version of that intra image P, for instance based on motion field vectors of the base layer (obtained during the decoding of the base layer performed by the first module) and on the enhanced version EI of neighbouring intra images I using extrapolation techniques as further explained below.

Each predictor Y is then converted into soft information representing the enhanced version X of the corresponding inter image P, i.e. a set of probabilities defining this enhanced version, by use of a noise model between X and Y. For instance, the distance between X and Y is modelled by a probabilistic distribution. In such as case, soft information representing X is a probabilistic distribution (e.g. a Generalized Gaussian Distribution or GGD) such that the distance between X and Y corresponds to the model probabilistic distribution.

The soft information is then passed to a soft decoder 20, for instance an LDPC decoder, adapted to retrieve, under normal operating conditions, the enhanced version X based on the soft information and the corresponding codewords C received in the enhancement bit stream 4 as further explained below.

The encoder 1 and the decoder 2 may each be implemented by a computer system, including a microprocessor, which performs respectively the encoding method and decoding method described here due to execution by the microprocessor of a computer program, loaded into a memory of the computer system for instance from a removable storage means.

Figure 3:
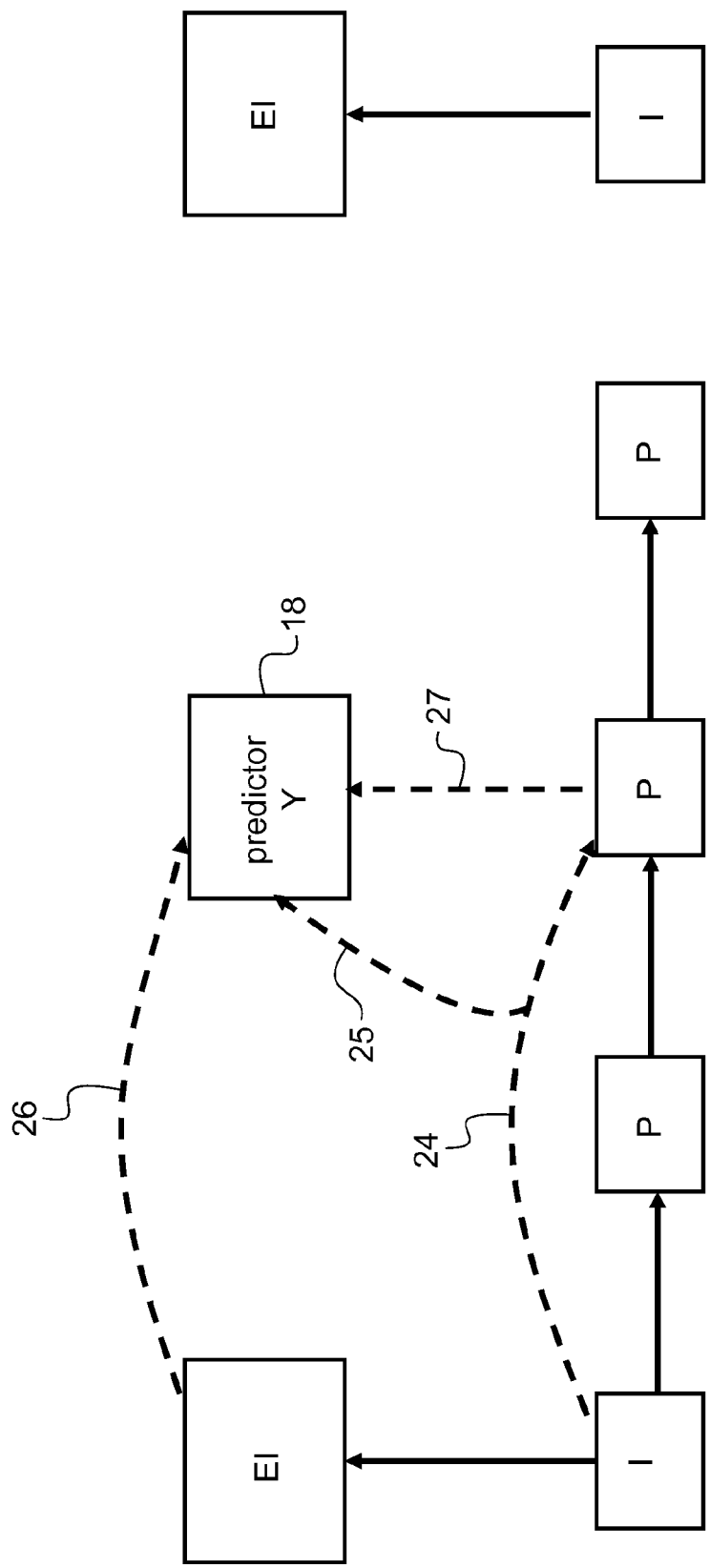
FIG. 3 shows a possible way of obtaining a predictor.

FIG. 3 shows a possible way of obtaining a predictor Y from motion field vectors 24 of the base layer and enhanced versions El of the neighbouring images, in accordance with mechanisms specified in the SVC scalable video compression system (see e.g. "*H.264 Advanced Video Coding for Generic Audiovisual Services*", ITU-T Telecommunication Standardization Sector of ITU, November 2007, Series H: Audiovisual and Multimedia Systems.

Motion information 24 from the base layer is up-sampled (represented as reference 25) to the resolution level of the enhancement (i.e. high resolution) layer.

A first version of the predictor Y is then determined by temporal prediction (thanks to the up-sampled motion information) based on at least one reference picture, e.g. the enhanced versions EI of the neighbouring intra images I, as shown by arrow 26.

The temporal residual defining the base version of the corresponding inter image P is also up-sampled to the resolution of the enhancement layer, as shown by arrow 27, and added to the first version of the predictor Y to obtain the predictor Y 18.

It may be noted that, if images are encoded by blocks (e.g. macroblocks), the process just described can be performed on a block-by-block basis.

Figure 4:
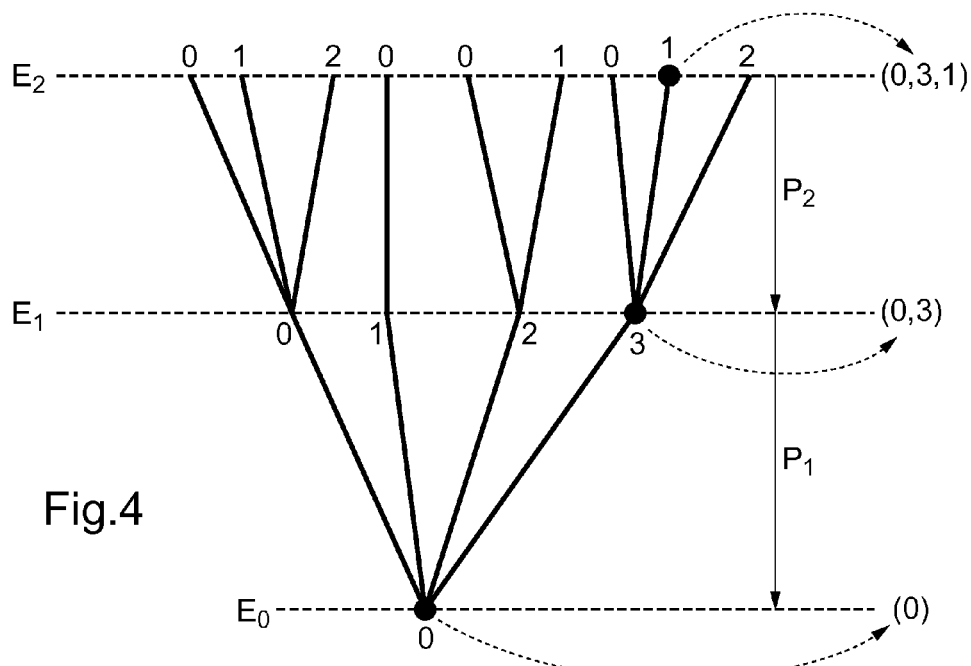
FIG. 4 illustrates a tree structure defining data in the enhancement layer.

FIG. 4 shows a tree structure according to which data X in the enhancement layer 12 are defined so as to be encoded by a scalable code as provided by the present invention.

Encoding of a set of data X into a codeword C according to a scalable code is described here in the context of the encoding of video data just described; this type of encoding according to a scalable code may however have many other applications.

According to the construction proposed, the set of data X is defined by symbols $\xi_i$ belonging to an alphabet $E_i$. Each symbol $\xi_i$ may be projected into another symbol $\xi_{i-1}$ (corresponding to a degraded version of the set of data X) belonging to another alphabet $E_{i-1}$ having a cardinal lower than $E_i$ (i.e. a number of elements lower than the number of elements of the alphabet E). Mathematically, this corresponds to defining a projection p, such that $\xi_{i-1} = p_i(\xi_i)$.

According to the embodiment described here, which uses a hierarchical representation shown in FIG. 4, each symbol $\xi_i$ is defined by the position of the leave of the tree at the various levels of the hierarchy: a symbol $\xi_i$ may thus be written as $(x_1, \ldots, x_i)$, where each $x_j$ is the numbering of the leave at level j.

The representation of a given symbol, or set of symbols, at the various levels correspond for instance to different quantification levels possibly used when obtaining the set of data X in the second module 11 of the encoder 1. In this respect, nested quantifiers may for instance be used: a quantum corresponding to a given symbol at certain level is split into several quanta each corresponding to distinct symbols at an upper level in the tree (which level provides a finer level of granularity).

The example given shown in FIG. 4 uses 2 information levels (the root of the tree $E_0$ containing no information). A symbol $\xi_2$ of alphabet $E_2$ is thus defined by two levels: $(x_1, x_2)$; this symbol $\xi_2$ is projected in alphabet $E_1$ by projection $p_2$ into a symbol $\xi_1$ defined by $x_1$ only.

It is proposed to define a scalable code as follows: for each level n of the tree-like structure (i.e. more generally speaking for each alphabet $E_n$), a code $H^n$ is defined by a M×N matrix, the elements of which are functions $h^n_{i,j}$ from the set $E_n$ to an associated Abelian group $G_n$. Such a definition of a code is for instance used in "*FFT-based BP Decoding of General LDPC Codes over Abelian Groups*", by A. Goupil, M. Colas, G. Gelle and D. Declercq in IEEE transactions on communications, 55(4), 2007, pp. 644-649.

Thus, each code $H^n$ defines a codeword c comprising M elements $c_i$ (each element $c_i$ belonging to the group $G_n$) associated to each information word z formed by N elements $z_i$ of $E_n$ as follows:

$$c_i = \sum_{j=1}^{N} h^n_{i,j}(z_j).$$

Codeword elements are thus defined by respective summations in the group $G_n$ (i.e. each codeword element is defined by a summation in the group $G_n$).

Codewords (or checks) are thus defined by elements in groups $G_n$, which are thus referred to below as groups of checks.

In addition, projections $\pi_n$ between the various groups of checks $G_n$ are defined as follows: each projection $\pi_n$ is a morphism from group $G_n$ to group $G_{n-1}$, which means that, for $c_1$ and $c_2$ in $G_n$, $\pi_n(c_1+c_2)=\pi_n(c_1)+\pi_n(c_2)$.

It is proposed for instance that groups $G_n$ be modular groups, that the cardinal of each group $G_{n-1}$ divides the cardinal of group $G_n$ (i.e. that the cardinal of $G_n$ equals an integer number of times the cardinal of group $G_{n-1}$, or that the cardinal of group $G_{n-1}$ is a divisor of the cardinal of group $G_n$) and that each projection $\pi_n$ (from $G_n$ to $G_{n-1}$) be defined by a modulo operation with a modulus equal to the cardinal of group $G_{n-1}$. (It may be reminded here that the cardinal of a set is the number of elements in this set. The modulo operation is the operation giving the remainder when dividing an integer by the modulus concerned.)

In the example described here, where information is represented in a 2-level hierarchy, the following can be used: $G_2=Z/m_1.m_2Z$ (the set of all congruence classes modulo $m_1.m_2$); $G_1=Z/m_1Z$ (the set of all congruence classes modulo $m_1$); $\pi_2$ is the modulo operation of modulus $m_1$ (i.e. $\pi_2(c_i)$ is the remainder of $c_i$ divided by $m_1$), where $m_1$ and $m_2$ are integer numbers.

To obtain scalable codes, it is proposed that codes $H^n$ at the various levels are defined such that: $\pi_n \circ h^n_{i,j}=h^{n-1}_{i,j} \circ p_n$ (over the whole matrices defining $H^n$ and $H^{n-1}$, i.e. for i between 1 and M and j between 1 and N). It is reminded that the "o" operator stands for the composition of two functions, i.e. f o g is defined by f o g(x)=f(g(x)) for any x.

This relationship between codes $H^n$ at the various levels allows these codes to be compatible: a code $H^{n-1}$ can be viewed as the projection of the code $H^n$.

This is because, as projections $\pi_n$ defined in the groups of checks are morphisms, the above definition of a codeword c according to code $H^n$ can be projected to the lower level as follows:

$$\pi_n(c_i) = \pi_n\left[\sum_{j=1}^{N} h^n_{i,j}(z_j)\right]$$
$$= \sum_{j=1}^{N} \pi_n[h^n_{i,j}(z_j)]$$
$$= \sum_{j=1}^{N} h^{n-1}_{i,j}[p_n(z_j)],$$

where the first equality is obtained by writing $c_i$ in accordance to the definition of code $H^n$ given above, where the second equality is true because the projection $\pi_n$ is a morphism and where the third equality comes from the relationship between code $H^n$ and code $H^{n-1}$ proposed above.

Thus, if a vector $c=[c_1 \ldots c_M]$ is a codeword associated with an information word $z=[z_1 \ldots z_N]$ in accordance with code $H^n$, the vector obtained by applying to this codeword c the projection $\pi_n$, i.e. $[\pi_n(c_1) \ldots \pi_n(c_M)]$, is the codeword associated by code $H^{n-1}$ with the information word obtained by applying the corresponding projection $p_n$ to the information word z, i.e. with information word $[p_n(z_1) \ldots p_n(z_N)]$.

When using modular groups as the groups of checks as mentioned above, codes $H^n$ fulfilling the above compatibility relationship ($\pi_n \circ h^n_{i,j}=h^{n-1}_{i,j} \circ p_n$) can be constructed as follows.

First, code $H^1$ (defined by a matrix of functions $h^1_{i,j}$ from alphabet EI at the lowest level to group of checks $Z/m_1Z$) can be chosen in a conventional manner, for instance in order to maximize the distance in the graph associated to the matrix. Use can be made for instance of a regular LDPC matrix, i.e. where the number of non nil elements per column does not depend on the column and the same applies for the lines. Use can be made of only three non-nil elements per column or even only two in the case of big modular groups (i.e. having a cardinal bigger than 64). Reference can be made for instance to the article "*Decoding and Performance of Nonbinary LDPC codes*", by David Declercq, in NewCom SWP1 meeting—28, Apr. 2005. There are many ways to generate more or less effective matrices, see for instance "*Construction of Non-Binary Quasi-Cyclic LDPC Codes by Arrays and Array Dispersions*", Bo Zhou et al., IEEE TRANSACTIONS ON COMMUNICATIONS, VOL. 57, NO. 6, JUNE 2009. It may also be noted that techniques used for the optimization of the graph of binary LDPC matrices can be used to determine the non-nil functions of our LDPC matrix.

Then, code $H^2$ is defined by a matrix of functions $h^2_{i,j}$ based on code $H^1$ as follows:

$h^2_{i,j}(z)=m_1 \cdot \sigma(x_2)+h^1_{i,j}(x_1)$, where $(x_1, x_2)$ is the writing of z in the tree structure representing $E_2$ (and thus $p_2(z)=x_1$) and $\sigma$ a function acting on the second level $x_2$ of the tree structure, i.e. a function from the set of possible leave numbers $(x_2)$ at the second level to modular group $Z/m_2Z$. The definition of function $\sigma$ is thus also conventional.

The compatibility relationship is fulfilled by these codes because:

$$\pi_2 \circ h^2_{i,j}(z)=\pi_2[m_1 \cdot \sigma(x_2)+h^1_{i,j}(x_1)]=h^1_{i,j}(x_1)=h^1_{i,j}(p_2(z))=h^1_{i,j} \circ p_2(z),$$

where the first and last equalities are only the definition of operator "o" as recalled above, where the second equality comes from the definition of projection $\pi_2$ as modulo operation of modulus $m_1$, and where the third equality comes from the link between z and $x_1$ just given.

When more than two hierarchical levels are used, further codes $H^n$ can be defined by a matrix of functions $h^n_{i,j}$ based on the code $H^{n-1}$ applied to the lower levels as follows:

$h^n_{i,j}(z)=|G_{n-1}| \cdot \sigma_n(x_n)+h^{n-1}_{i,j}[(x_1, \ldots, x_{n-1})]$, where the hierarchical representation of z is $(x_1, \ldots, x_{n-1}, x_n)$, where $G_n$ a function acting on the $n^{th}$ level $x_n$ of the tree structure, i.e. a function from the set of possible leave numbers $(x_n)$ at the $n^{th}$ level to modular group $Z/m_nZ$ (where $m_n=|G_n|/|G_{n-1}|$) and where $|G_{n-1}|$ and $|G_n|$ are respectively the cardinal of the group $G_{n-1}$ and the cardinal of the group $G_n$.

It may be noted in addition that, in the case of LDPC codes, codes constructed on non one-to-one (i.e. non-injective) functions have poor performance. It is thus preferable to use groups of checks having a sufficient size, in particular such that:

$|G_k|/|G_{k-1}| \geq |E_k|/|E_{k-1}|$, i.e. with the notation above: $m_k \geq |E_k|/|E_{k-1}|$ (where $|\cdot|$ is the cardinal of the set concerned as already noted).

Figure 5:
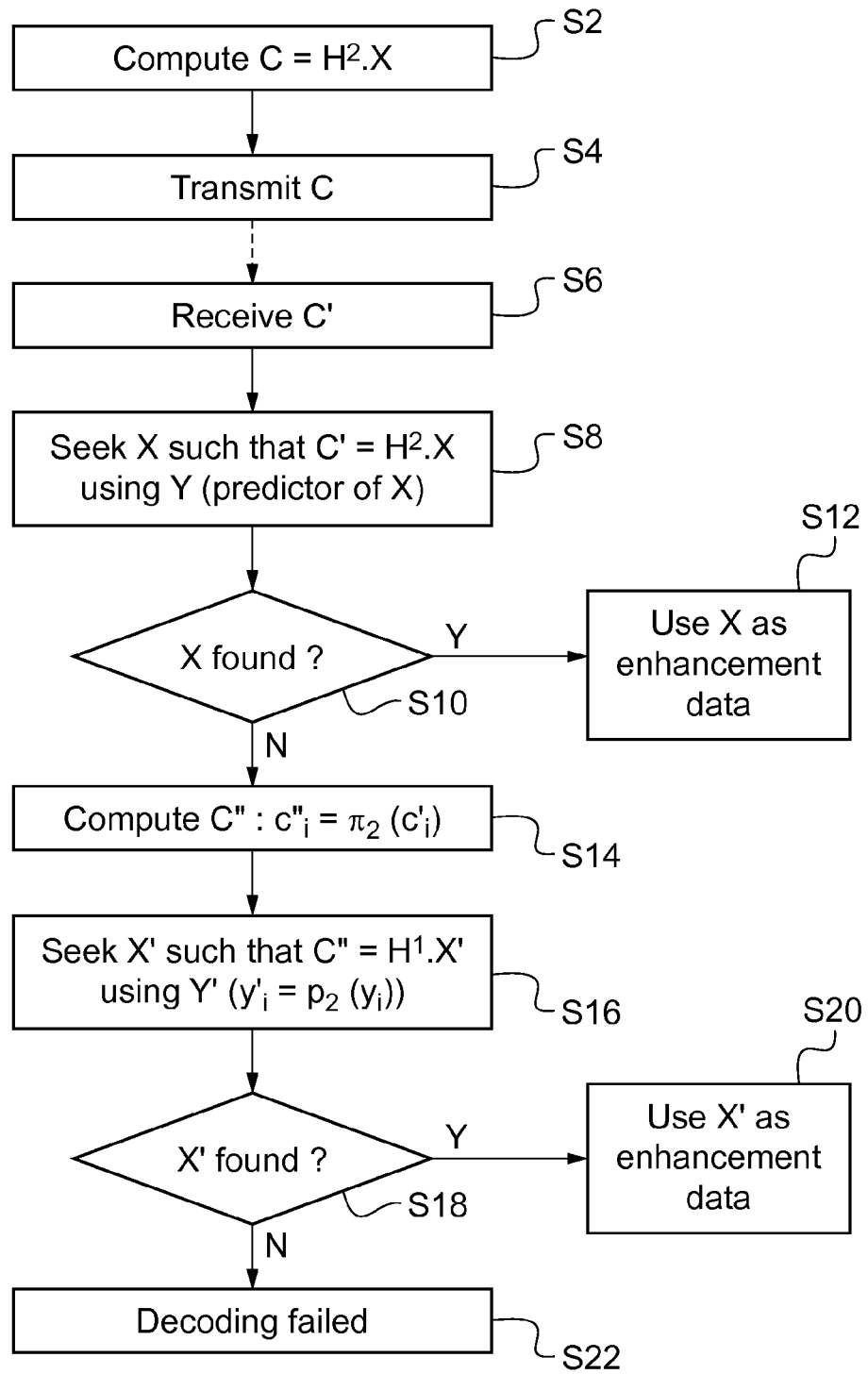
FIG. 5 presents an exemplary decoding process using a scalable code in accordance with the teachings of the invention.

FIG. 5 presents an exemplary encoding and decoding process using the scalable code just defined in the context of the embodiment of FIG. 1.

At the encoder 1, an information word X amongst data forming the enhancement layer 12 is encoded (step S2) using the code $H^2$ defined above: a code word C is obtained by computing $H^2.X$.

It may be recalled here that the information word X comprises N elements (or symbols) $\xi_i$ belonging each to the set $E_2$. Each element $\xi_i$ can be written according to the representation given in FIG. 4: $\xi_i=(x_{i,1}, x_{i,2})$. For instance, data $x_{i,1}$ represent the enhancement layer using a first quantization level, whereas data $(x_{i,1}, x_{i,2})$ represent the enhancement layer using a second quantization level, leading to a higher resolution than the first quantization level (i.e. with a smaller quantization step than the first quantization level).

It may also be recalled that the code word C comprises M elements (or symbols) c, belonging each to the set $G_2$, here the modular group $Z/m_1.m_2Z$:

$C=[c_1 \ldots c_m]$.

The code word C is transmitted over the communication channel at step S4. In the present case, the information word X is not sent over the communication channel as it is proposed here to use instead a predictor Y computed at the decoder 2. It should be understood however that the invention also applies to cases where the information word X is sent together with the code word C over the transmission channel.

The code word C' is received at the decoder 2 in step S6. Of course, the received word may differ from the word computed and transmitted by the encoder 1 due to errors generated in the transmission channel, hence the notation $C'=[c'_1 \ldots c'_M]$.

At step S8, the soft decoder 20 seeks to retrieve the information word X by applying a decoding algorithm, adapted to the code $H^2$, to the received code word C' and to soft information derived from a predictor Y of the information word X as mentioned above.

This is done for instance by maximum likelihood decoding, i.e. by seeking an information word $X^e$ and a code word $C^e$ which are associated according to the code concerned (here $H^2$), i.e. such that $C^e=H^2.X^e$, and which minimize a distance to the predictor Y (or to the information word received in the variation mentioned above) and code word received C', i.e. a distance $d[(X^e,C^e),(Y,C')]$.

In practice, the distance may be a probability of occurrence of symbols deduced from a channel model. Knowing the predictor $Y=[y_1, \ldots y_N]$ and following a probabilistic channel model, we deduce the probability $P_{y_i}(\xi_i)$ of the i-th symbol of X to be $\xi_i$. Thus, the probability of the word $X=[\xi_1, \ldots \xi_N]$ is $$P(X) = \prod_{i=1}^{N} P_{y_i}(\xi_i)$$

and this probability is the distance to the predictor Y. The LDPC decoder makes it possible to find X such that HX=C and with the minimum distance to Y.

In the case of an LDPC code described here, the decoding algorithm is for instance a belief propagation algorithm, where the matrix $H^2$ defining the code is represented in a Tanner graph. Such algorithms are described for instance in "*Understanding Belief Propagation and its Generalizations*", by J. S. Yedidia, W. T. Freeman, Y. Weiss, Mitsubishi Electric Research Laboratories and "*A recursive approach to low complexity codes*", by M. Tanner, IEEE Trans. Inform. Theory, 27(5), 533-547, September 1981.

It may be noted that sub-optimal decoding algorithms have been proposed to reduce the necessary calculations, such as in "*Fast Min-Sum Algorithm over GF(q)*" by X. Huang, S. Ding, Z. Yang & Y. Wu, IEEE Information Theory Workshop, Chengdu, China, 2006 and in "*Min-Max decoding for non-binary LDPC codes*", V. Savin, IEEE International Symposium on Information Theory, 2008, 960-964.

Although information symbols and check symbols are taken in the same set in these articles, the techniques described also apply to the present case where information symbols and check symbols taken in two distinct sets, as shown for instance in the article "*FFT-based BP Decoding of General LDPC Codes over Abelian Groups*" already cited.

In the example described here where the groups of checks $G_2$ is a modular group (and thus an Abelian group), use can be made of the decoding algorithm described in the paper "*FFT-based BP Decoding of General LDPC Codes over Abelian Groups*" mentioned above.

In addition, noticing that Fourier transforms on modular groups Z/nZ are similar to Discrete Fourier Transforms of length n, fast Fourier transforms computation to be implemented according to this decoding algorithm can be performed using known Discrete Fourier Transform computation algorithms (see e.g. "*The design and implementation of FFTW3*", by M. Frigo & S. G. Johnson, Proc. IEEE 93(2), 216-231 (2005) and "*Complexity Comparison of Non-Binary LDPC Decoders*", by L. Conde-Canencia, A. Al. Ghouwayel & E. Boutillon, ICT-Mobile Summit 2009, Conference Proceedings).

The iterative decoding algorithm used is thus initialized using the soft information derived from the predictor Y and the probabilistic noise model: the probability $P_{y_i}(\xi_i)$ is associated to the occurrence $\xi_i$ of the i-th symbol of X. By denoting $\delta(\xi_i, y_i)$ the distance between $\xi_i$ and $y_i$ according to a metric defined in the set $E_2$ and modelling the noise by a Gaussian distribution G(s,.), this probability may be written: $P_{y_i}(\xi_i)=G[s, \delta(\xi_i, y_i)]$.

For instance, if the metric is the difference between the centroids of quanta associated respectively with $\xi_i$ and $y_i$, and if noise model is additive, the probability is given by:

$P_{y_i}(\xi_i)=G[s, |q(\xi_i)-q(y_i)|]$ where $q(\xi_i)$ and $q(y_i)$ are the values of the centroids of the quanta respectively associated with $\xi_i$ and $y_i$.

After some iterations (e.g. a predetermined number of iterations) of the algorithm, it is determined (step S10) whether or not the algorithm could successfully retrieve the information word X such that $C=H^2.X$.

If the predictor Y and the code word received C' make it possible to retrieve the information word X (in practice the estimated word mentioned $X^e$ above) using the decoding algorithm associated with (here LDPC) code $H^2$, then the information word X is used as enhancement data by the decoder 2 (step S12).

However, if the decoding based on the code $H^2$ was unsuccessful, the scalability of the code is used as follows.

At step S14, the decoder 2 computes a degraded version C" of the codeword by applying the projection $\pi_2$ to each of the elements $c_i$ of the word C':

$C''=[\pi_2(c'_1) \ldots \pi_2(c'_M)]$. The elements of C" thus belong to $G_1$ (here $Z/m_1Z$).

On the other hand, projection $p_2$ is applied on the side of the information word. In the present case where a predictor is used, a degraded version Y' of the predictor is computed by applying projection $p_2$ to the elements of the predictor Y used previously: each element $y'_i$ of the degraded version Y' is computed as $y'_i=p_2(y_i)$ (where $y_i$ is the corresponding element in the predictor Y).

In the variation mentioned above where the information word X is transmitted together with the code word C, the projection $p_2$ is applied to each element of the information word X in order to obtain a degraded version $X'=[p_2(\xi_1) \ldots p_2(\xi_N)]$.

In the case of the embodiment described here (use of a predictor), the process continues as follows: at step S16, the soft decoder 20 seeks to retrieve a degraded version X' of the information word X by applying a decoding algorithm, adapted to the code $H^1$ defined above, to the degraded version C" of the received code word and to soft information derived from the degraded predictor Y'. (When the information word X is transmitted, its degraded version X' is used as input to the decoding algorithm with the degraded version C" of the code word.)

Soft information is for instance derived from the degraded predictor Y' by using a probabilistic model linked to the model used at step S8 as follows: $P_{y'_i}(\chi_d) = \Sigma_{p_2(\xi)=\chi_d} P_{y_i^c}(\xi)$, where $y^c_i$ is an element of $E_2$ such that $y'_i = p_2(y^c_i)$, for instance the symbol corresponding to the central quantum (at the fine level) with respect to the quantum associated with symbol $y'_i$ at the coarse level in the case of nested quantifiers already mentioned.

An iterative belief propagation algorithm of the same type as described above with respect to step S8 can be used to perform step S16; the decoding algorithm of step S16 is however adapted to the code $H^1$ (instead of being adapted to the code $H^2$ in step S8).

It is then determined at step S18 whether or not the decoding algorithm could successfully retrieve X' such that $C''=H^1.X'$.

If the decoding was successful, the word X' is used as enhancement data, as a degraded version of the data represented by the information word X. This is because, in view of the properties of codes $H^1$, $H^2$ and projections $p_2$, $\pi_2$ explained above, elements of the retrieved word X' are projections $p_2(\xi_i)$ of corresponding elements of the information word X, i.e. according to the hierarchical notation:

$X'=(x_{1,1} \ldots x_{N,1})$. Thus, each element is only represented by the lower information level in the tree structure of FIG. 4. This corresponds for instance to a lower resolution (larger quantization step) in the context of FIG. 1.

If the decoding was unsuccessful, it is considered the decoding has failed (step S22).

Figure 6:
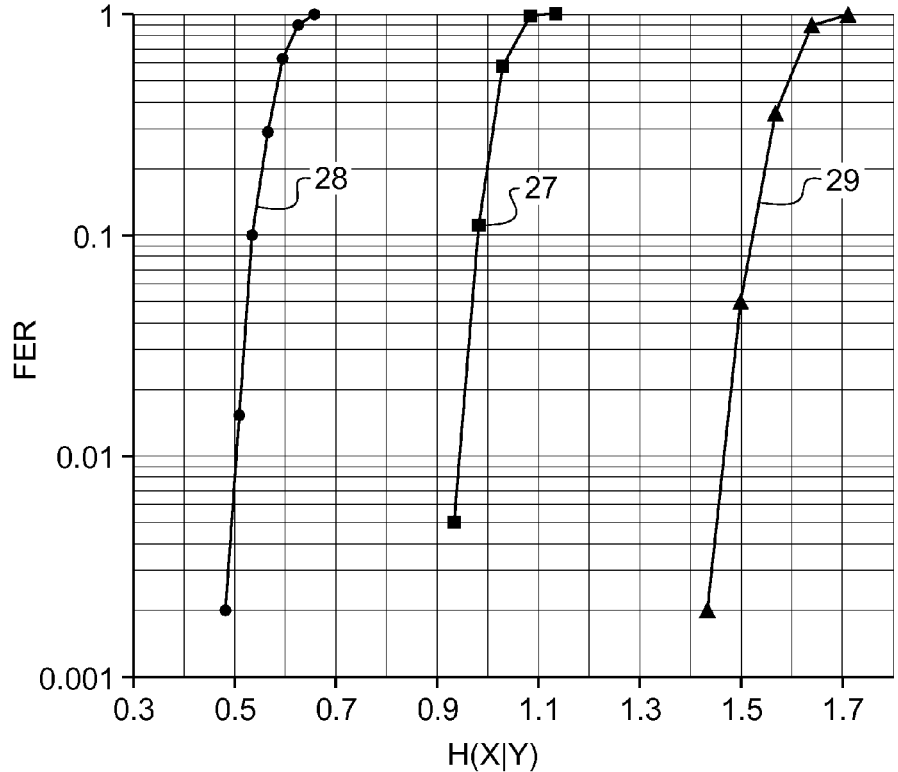
FIG. 6 shows the decoding performance of an exemplary scalable code.

FIG. 6 shows the decoding performance of an exemplary scalable code as proposed by the invention compared to a conventional (i.e. non scalable) code.

This performance is evaluated by simulating the behaviour of a scalable code based on LDPC codes $H^1$, $H^2$ as proposed above, with the following values: N=2000; M=857; $m_1=m_2=3$; alphabet $E_2$ has 9 elements (i.e. $|E_2|=9$), alphabet $E_1$ has 3 elements (i.e. $|E1|=3$), which means that, in the tree-like structure, the first level has 3 leaves and each leave of the first level has 3 (daughter-) leaves in the second level.

The decoding algorithms for decoding code $H^1$ on the one hand and code $H^2$ on the other hand use a belief propagation method based on Fast-Fourier Transform as explained above and known from the article "*FFT-based BP Decoding of General LDPC Codes over Abelian Groups*", Alban Goupil, Maxime Colas, Guillaume Gelle and David Declercq, in IEEE Transactions on Communications, 55(4), 2007. Only 10 iterations are used in these decoding algorithms to simulate a realistic case.

The communication channel is modelled by an additive noise on the transmitted data, the noise v having a standard deviation s and a generalized Gaussian distribution of exponent $\beta$ (here $\beta=1$: a Laplacian distribution is used) defined by the following law:

$P(v=d) \propto \exp(-|d/s|^\beta)$ for any integer $d$ (where the symbol $\propto$ stands for "proportional to"), such that the probability deduced from the noise is $P_{y_i}(\xi_i) \propto \exp(-|(q(\xi_i)-q(y_i))/s|^\beta)$.

The performance of error correction codes is measured in FIG. 6 by plotting the Frame Error Rate (FER), i.e. the ratio of the number of frames not perfectly decoded on the total number of frames attempted to be decoded, as a function of noise entropy H(X|Y), when using the code concerned. Practically, words X and their corresponding checks C are generated, then each word X is randomly perturbated to obtain a word Y=X+v after an additive noise v has been added. This perturbated word is used as the predictor and the amount of information lost in the process is measured by the noise entropy, i.e. the conditional entropy H(X|Y) of X knowing Y.

Curve 27 shows the performance of a (conventional) non scalable LDPC code which decodes all of the 9 symbols. Its decoding capacity (roughly 1.1 bit) is quite far from the theoretical decoding capacity of 1.36 bits for such a code: it falls about 0.25 bit short from a perfect correction. This is due to the small number of iterations allowed as mentioned above (10 iterations) and the finite length of the code. By allowing 1000 iterations, one reaches a decoding capacity of 1.3 bits, very close to the theoretical capacity.

Curves 28 and 29 show the performance of a scalable LDPC code, respectively using the code $H_2$ (where information words are written using alphabet $E_2$ with 9 elements) and using the code $H_1$ (where information words are written using alphabet $E_1$ with 3 elements). The curve 27 is to the left compared to the curve 28, which means that the top-level scalable LDPC code has worse decoding capacity than the non-scalable LDPC code. This is the price (the overhead) to pay to obtain scalability with a much higher lower-level decoding capacity.

Their respective theoretical capacities are, with a shift of −0.25 dB due to the imperfection of the code, 0.55 bit (0.65 bit in the practical example shown in FIGS. 6) and 1.7 bits. It is thus observed that the scalability of the LDPC code does not sacrifice the decoding capability.

Finally it is clear that the decoding using 3 symbols only (curve 29) is much more resistant to noise (up to 1.7 bits) compared to the decoding of all 9 symbols (up to 0.55 bit of noise only). This fulfils the condition of the possibility of degraded decoding in adverse conditions.

The examples given above are only possible embodiments of the invention, which is not limited thereto.

What is claimed is:

1. A method for decoding comprising the following steps:
receiving a first codeword comprising a plurality of elements of a first finite commutative group and associated to a plurality of symbols in accordance with a first code defining codeword elements by respective summations in said first finite commutative group;
determining, by applying a projection onto elements of the first codeword, a second codeword comprising a plurality of elements of a second finite commutative group having a cardinal strictly smaller than the cardinal of the first finite commutative group, wherein the projection is a morphism from the first finite commutative group to the second finite commutative group; and
decoding the second codeword in accordance with a second code defining codeword elements by respective summations in said second finite commutative group.

2. The decoding method according to claim 1, wherein the first finite commutative group and the second finite commutative groups are modular groups.

3. The decoding method according to claim 2, wherein the cardinal of the second finite commutative group is a divisor of the cardinal of the first finite commutative group and wherein the projection is a modulo operation having a modulus equal to the cardinal of the second finite commutative group.

4. A method for retrieving an information word, comprising the following steps:
receiving, on a transmission channel, a first codeword comprising a plurality of elements of a first finite commutative group;
attempting retrieval of said information word, using the first codeword and according to a first code defining codeword elements by respective summations in said first finite commutative group; and
in case of failure of said retrieval,
determining, by applying a projection to elements of the first codeword, a second codeword comprising a plurality of elements of a second finite commutative group having a cardinal strictly smaller than the cardinal of the first finite commutative group, wherein the projection is a morphism from the first finite commutative group to the second finite commutative group; and
attempting retrieval of said information word, using the second codeword and according to a second code defining codeword elements by respective summations in said second finite commutative group.

5. The retrieving method according to claim 4, wherein the first finite commutative group and the second finite commutative groups are modular groups.

6. The retrieving method according to claim 5, wherein the cardinal of the second finite commutative group is a divisor of the cardinal of the first finite commutative group and wherein the projection is a modulo operation having a modulus equal to the cardinal of the second finite commutative group.

7. The retrieving method according to claim 4, wherein the information word is representative of data included in a video enhancement layer.

8. The retrieving method according to claim 7, comprising a step of determining a predictor of said information word based on a corresponding video base layer and wherein the step of attempting retrieval using the first codeword is performed based on said predictor.

9. The retrieving method according to claim 8, comprising a step of projecting elements of said predictor, the projected elements forming a projected predictor, and wherein the step of attempting retrieval using the second codeword is performed based on said projected predictor.

10. The retrieving method according to claim 4, comprising a step of receiving a transmitted information word, wherein the step of attempting retrieval using the first codeword is performed based on said transmitted information word.

11. The retrieving method according to claim 10, comprising a step of projecting elements of said transmitted information word and wherein the step of attempting retrieval using the second codeword is performed based on said projected elements.

12. A method for encoding a word comprising a plurality of symbols, comprising the following steps:
encoding said word into a first codeword associated to said word in accordance with a first code defining codeword elements by respective summations in a first commutative group; and
determining, by applying a projection to elements of the first codeword, a second codeword comprising a plurality of elements of a second finite commutative group having a cardinal strictly smaller than the cardinal of the first finite commutative group, wherein the projection is a morphism from the first finite commutative group to the second finite commutative group.

13. A method of transmitting a word comprising a plurality of symbols, comprising the following steps:
encoding said word using an encoding method according to claim 12;
obtaining a projected word by projection of said word; and
transmitting said projected word and said second codeword on a transmission channel.

14. A decoding device comprising:
a receiving module configured to receive a first codeword comprising a plurality of elements of a first finite commutative group and associated to a plurality of symbols in accordance with a first code defining codeword elements by respective summations in said first finite commutative group;
a computing module configured to determine, by applying a projection to elements of the first codeword, a second codeword comprising a plurality of elements of a second finite commutative group having a cardinal strictly smaller than the cardinal of the first finite commutative group, wherein the projection is a morphism from the first finite commutative group to the second finite commutative group; and
a decoding module configured to decode the second codeword in accordance with a second code defining codeword elements by respective summations in said second finite commutative group.

15. A device for retrieving an information word, comprising:
a receiving module configured to receive, on a transmission channel, a first codeword comprising a plurality of elements of a first finite commutative group;
a decoding module configured to attempt retrieval of said information word, using the first codeword and according to a first code defining codeword elements by respective summations in said first finite commutative group; and
a computing module configured, in case of failure of said retrieval, to determine, by applying a projection to elements of the first codeword, a second codeword comprising a plurality of elements of a second finite commutative group having a cardinal strictly smaller than the cardinal of the first finite commutative group, wherein the projection is a morphism from the first finite commutative group to the second finite commutative group,
wherein the decoding module is configured to attempt retrieval of said information word, using the second codeword and according to a second code defining codeword elements by respective summations in said second finite commutative group.

16. A non-transitory information storage means, able to be read by a computer system, comprising instructions for a computer program adapted to implement a method according to claim 1, when this program is loaded into and executed by the computer system.

17. Computer program product able to be read by a microprocessor, comprising portions of software code adapted to implement a method according to claim 1, when it is loaded into and executed by the microprocessor.

* * * * *